United States Patent [19]
Destefan et al.

[11] Patent Number: 5,021,625
[45] Date of Patent: Jun. 4, 1991

[54] PRE-RESISTANCE-WELDING RESISTANCE CHECK

[75] Inventors: Dennis E. Destefan, Broomfield, Colo.; David A. Stompro, Idaho Falls, Id.

[73] Assignee: United States Department of Energy, Washington, D.C.

[21] Appl. No.: 362,990

[22] Filed: Jun. 8, 1989

[51] Int. Cl.⁵ .............................................. B23K 11/25
[52] U.S. Cl. ...................................... 219/109; 219/110
[58] Field of Search ................................. 219/109, 110

[56] References Cited

U.S. PATENT DOCUMENTS

| 3,873,830 | 3/1975 | Forster | 250/236 |
| 4,639,569 | 1/1987 | Dufrenne | 219/109 |
| 4,963,830 | 10/1990 | Roth et al. | 219/109 |

OTHER PUBLICATIONS

U. Mallya, "Effects of Contact Resistance in Resistance Welding of Aluminum", Welding Journal, Feb. 1984; pp. 41-44.
*Resistance Welding Data Book*, P. R. Mallory & Company Publisher, Fourth Edition; pp. 9-13, pp. 85, 87, 100-102 and 104-106.
*Welding For Engineers*, Udin, Funk, Wulff, John Wiley Publisher, New York, 1954; Chap. 4, pp. 44-67.
Model 510A, 4 ½ Digit Micro-Ohmmeter, Cambridge Technology, Inc. Cambridge, MA.

*Primary Examiner*—Clifford C. Shaw
*Attorney, Agent, or Firm*—George H. Libman; James H. Chafin; William R. Moser

[57] ABSTRACT

A preweld resistance check for resistance welding machines uses an open circuited measurement to determine the welding machine resistance, a closed circuit measurement to determine the parallel resistance of a workpiece set and the machine, and a calculation to determine the resistance of the workpiece set. Any variation in workpiece set or machine resistance is an indication that the weld may be different from a control weld.

12 Claims, 2 Drawing Sheets

PRE-RESISTANCE-WELDING RESISTANCE CHECK

The U.S. Government has rights in this invention under Contract DE-ACO4-76DPO3533 between the Department of Energy and Rockwell International Corporation.

BACKGROUND OF THE INVENTION

This invention relates generally to the use of preweld resistance measurements to endure weld repeatability of a resistance weld and, more specifically, to a system for checking both welder resistance and part resistance prior to welding.

Resistance welding is a techique of joining metals in which the heat necessary for welding is generated by the electrical resistance to an electrical current at the joint of parts. For a typical resistance weld, an AC voltage is applied to the input of a step-down transformer and a welding current loop is formed at the transformer output terminals. This loop usually includes a current path from one side of a two-terminal transformer output to a moveable first electrode and a current path from the other terminal to a fixed or moveable second electrode. Two electrically conductive workpieces complete the current loop; the first workpiece being in electrical and physical contact on one surface with the first electrode and on an opposing surface with one surface of the second workpiece. Another surface of the second workpiece is in electrical and physical contact with the second electrode. A ram, or other means for applying pressure, presses the first electrode toward the second electrode, squeezing the two workpieces between the electrodes. Ideally, the maximum resistance in this current loop is at the physical connection between the two workpieces. In this event, the maximum heat loss in the loop occurs at the location to be welded. The welding heat is proportional to $I^2RT$, where I is the current through the loop, R is the resistance of the workpiece junction, and T is the length of time current is flowing.

Since flux need not be applied during the welding operation, and since the weld does not require a moving electrode to follow a weld line, resistance welding is well suited to mass production welding of workpieces shaped in a manner permitting them to be held in proper alignment by the squeezing force between the electrodes. Squeezing identical sets of parts with the same force, and passing the same current through them, should result in identical welds.

The two principal, controllable, variables in resistance welding are the electrical energy input to the weld and the electrode pressure. The electrical energy input is typically controlled by electronic means to adjust the portion of the input waveform that is applied to the transformer, thereby controlling the power to the transformer. Current regulators may be used to ensure that a constant welding current, voltage or power is applied to the output loop.

Welding pressure is important because of the nature of the contact between two metallic pieces. When two cold surfaces are pressed together, much of the cross-sectional area is in physical oxide-to-oxide contact. A small fraction of this physically contacting area comes into actual metallic contact due to the oxide film. The remainder of the joint consists of thin oxide-lined voids which provide no current path.

Since voids and cold metal oxides do not conduct electricity, only the scattered points of metallic contact carry current, causing high concentrations of current and associated rapid heat generation. The contact resistance of the interface is inversely proportional to pressure; i.e, the higher the pressure on the interface the more contact among metal points between the voids, and the lower the contact resistance.

The generation of heat at the interface, the natural result of high current conduction, usually lowers the joint resistance. The amount of the reduction is also a function of pressure.

Therefore, in order to get repeatable welds in a production environment, the operator must determine what current and pressure gives a desirable weld, and repeat it for each successive weld. Unfortunately, experience shows that changes in the welding machine and differences between sets of workpieces can produce noticeable changes in welds.

SUMMARY OF THE INVENTION

It is an object of this invention to provide a system for checking the resistance of a welding machine and workpieces prior to welding.

It is also an object of this invention to use a low direct current for checking resistance of a welding machine and workpieces prior to welding.

It is a further object of this invention to prevent the welding. of workpieces when preweld resistance measurements indicate welding characteristics have changed.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise a method of preweld testing of an electric resistance welding machine including measuring the welding machine resistance $R_M$, and then placing a workpiece set in welding position under pressure between the first and second electrodes. The parallel resistance $R_P$ of $R_M$ and the workpiece resistance $R_W$ is then measured, and $R_W$ is calculated. The measured value of $R_W$ is compared with a control value determined from a similar control workpiece set that previously welded properly, a difference between $R_W$ and the control value being an indication that the workpiece set would not weld properly.

The invention also preferably includes a welding machine including a control for performing the aforementioned method.

BRIEF DESCRIPTION OF THE DRAWINGS

The accompanying drawings illustrate an embodiment of the present invention and, together with the description, serve to explain the principles of the invention.

DETAILED DESCRIPTION OF THE INVENTION

Figure 1:
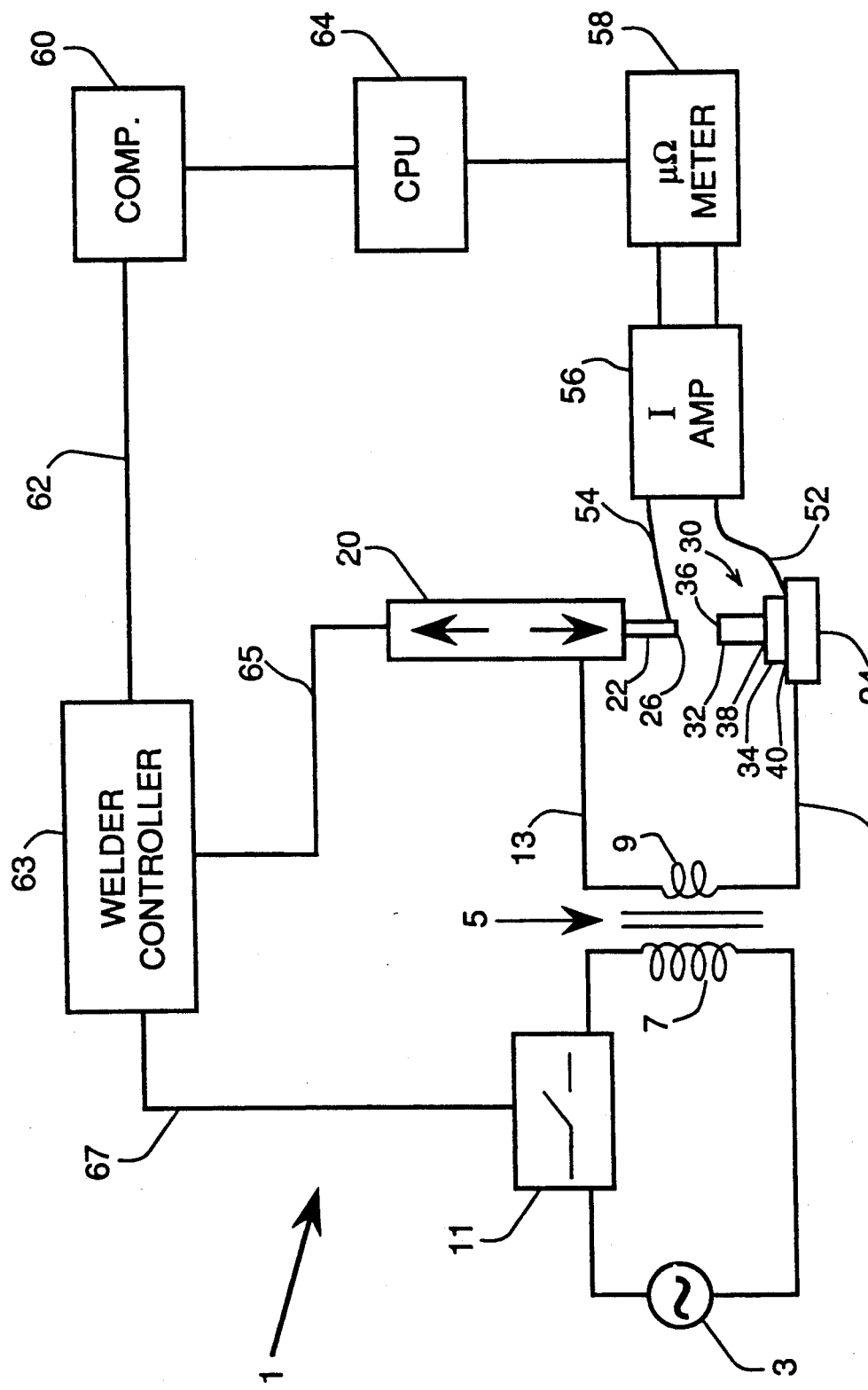
FIG. 1 shows a resistance welding machine incorporating the invention.

FIG. 1 shows a schematic representation of a resistance welder 1 to include a pair of spaced electrodes 22, 24. At least first electrode 22 is attached to one end of a ram 20 of movement towards or away from opposed second electrode 24. Movement of ram 20, and the amount of force it imparts toward electrode 24, is controlled by output 65 of controller 63 in a manner well known to those of ordinary skill in this art. Electrodes 22 and 24 are connected respectively to first and second terminals of a source of electrical power, as discussed hereinafter.

Workpiece set 30 includes at least two workpieces to be welded together. It is shown in this example as a first cylindrical workpiece 32 to be welded at joint 38 to a surface of second plate workpiece 34. In operation, controller 63 causes ram 20 move the tip 26 of electrode 22 into physical and electrical contact with a surface 36 of workpiece 32 opposite joint 38 between the workpieces. An opposite surface of second workpiece 34 makes physical and electrical contact 40 with second electrode 24.

For the single phase AC welder illustrated, welding current is applied to workpiece set 30 from an AC source 3 connected through electrical switch 11 to input coil 7 of stepdown transformer 5. Output coil 9 has a first terminal 13 connected to ram 20 and electrode 22 and a second terminal 15 connected to electrode 24. Output 67 of controller 63 causes electrical switch 11 to connect controlled portions of the output of source 3 through transformer 5 to the output current loop including electrode 22, workpiece set 30, electrode 24 and transformer output coil 9.

Figure 2:
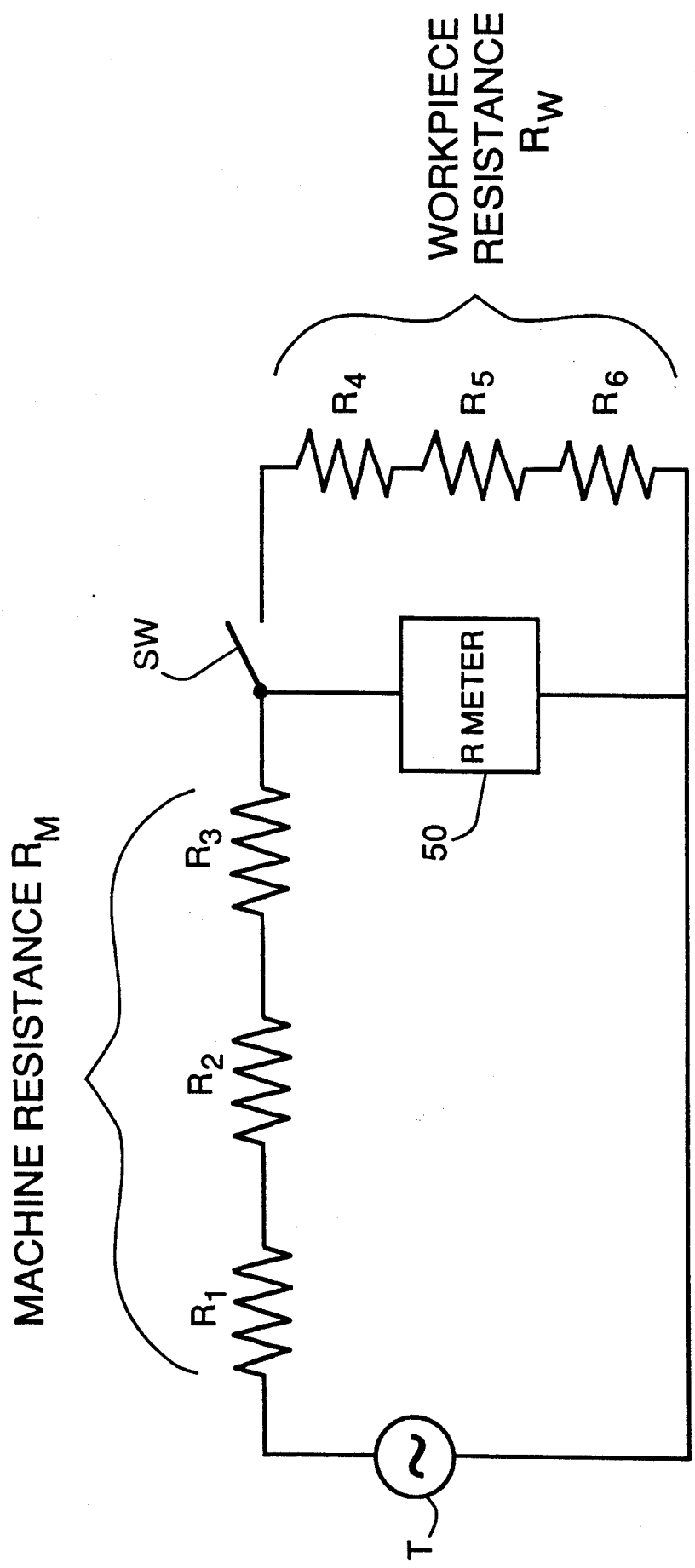
FIG. 2 shows the equivalent circuit of the welding machine of FIG. 1.

FIG. 2 shows an electrical circuit of the resistance of the output loop of welder 1 to include a voltage source T, machine resistance $R_M$, and workpiece resistance $R_W$. Voltage source T corresponds to the output voltage across terminals 13, 15 of transformer 5. Machine resistance $R_M$ includes resistance R1 of output coil 9, resistance R2 of the conductors and connections carrying current between output coil 9 and the electrodes, and resistance R3 of ram 20 and electrodes 22, 24. Workpiece resistance $R_W$ includes resistance R4 of the interfaces between electrodes and workpieces at 26, 36 and 40, resistance R5 of workpiece set 30, and resistance R6 of weld joint 38.

Of the aforementioned resistances, $R_M$ is usually relatively constant during a welding session, as the conductors between transformer 5 and the electrodes are heavy, flexible conductors firmly connected at each end. However, occasional changes in $R_M$ occur because conductor bolts loosen due to movement or temperature cycles, the welder receives maintenance, or the conductors overheat. These changes have a corresponding effect on the weld operation.

Workpiece resistance $R_W$ can easily vary between different sets of workpieces. While part resistance R5 should remain constant for identical workpiece sets, interface resistance R4 and weld joint resistance R6 are each a function of the cleanliness of the contacting surfaces.

This invention recognizes that identical welds over successive workpiece sets will occur when successive measurements of $R_M$ and $R_W$ are substantially constant. Since $R_W$ is dependent upon the cleanliness of the contacting surfaces and the pressure applied on workpieces set 30 by ram 20, the measurement of $R_W$ is meaningful only when it is made with workpiece set 30 in a welding arrangement.

In order to make the aforementioned resistance measurements, a device 50 for measuring resistance has a first lead 54 solidly connected to electrode 22 close to contact surface 26, and a second lead 52 solidly connected to electrode 24 close to contact 40. Connection of leads 52 & 54 to electrodes 22 & 24 requires adequate consideration be given to thermoelectric potentials & temperature stability. Device 50 may be a microohmeter 58 such as a Model 510A of Cambridge technology Inc. It may include a current amplifier 56 such as Model 508 of the same manufacturer. The output of micoohmeter 58 is fed into a microprocessor 64 for a simple calculation to be described later, and the output of microprocessor 64 may be read by a Model 512 limits comparator that provides a signal output 62 when the measured value exceeds a preset limit. Output 62 may control welder controller 63 in a manner well known to those of ordinary skill in the art.

In the operation of this invention, machine resistance $R_M$ is measured with a direct current by device 50 with workpiece set 30 not in contact with each electrode. The equivalent circuit for this measurement is shown in FIG. 2 with switch SW in the open position. This value is not changed by microprocessor 64 and is compared in comparator 60 with a control value made during a successful weld cycle. If the comparison is out of range of the control value, controller 63 may be set to either stop the weld cycle and sound an alarm, or to adjust the voltage applied to transformer 5 to counteract the effects of the resistance change. For example, if the machine resistance had increased, more input voltage would be needed to achieve the desire output current.

Once this first test is completed, workpiece set 30 is placed in position and controller 63 causes ram 20 to press the electrodes against workpiece 30 with the predetermined welding force.

A second measurement is now made with device 50, the equivalent circuit being the circuit of FIG. 2 with switch SW closed. The measured resistance $R_P$ is the measurement of the welder impedance $R_M$ in parallel with the workpiece impedance $R_W$. Since $R_M$ and $R_P$ measured values, $R_W$ is calculated by microprocessor 64 using the relation:

$$R_W = (R_M)(R_P)/(R_M - R_P).$$

This value, representative of the pre-weld resistance of the workpiece set in a ready-to-weld configuration, is compared with a control value made during a successful weld cycle. Again, if the comparison is out of a predetermined range of the control value, controller 63 may either stop the weld cycle and sound an alarm or adjust the weld current to compensate for the change in resistance.

This invention contemplates the use of other current sources. However, the applied current should not cause noticeable resistance heating of any components of $R_M$ or $R_W$. Furthermore, direct current has the advantage of eliminating inaccuracies caused by inductive components of the current loop, as movement of leads 52, 54 may cause measured changes in impedance at microhm levels.

Tests of the invention at DC levels up to 20 amps have not shown a change in impedance over time that would indicate resistive heating.

Of course, various resistance measurements have previously been made in resistance welding applications, but these measurements have not provided the improved results of this invention. For example, measuring the change in resistance of the workpiece set as a function of pressure is well known. However, this measurement has limited value unless it is made with the workpiece set in welding position between electrodes of a welder, as the resistance of each of the three joints (first electrode 26—workpiece 36; workpiece—workpiece 38; workpiece—second electrode 40) may change every time the arrangement is altered.

Furthermore, a resistance measuremnt of the parallel resistance, by itself, does not provide nearly enough information as the invention. A change in $R_P$, without knowledge of $R_M$, cannot show whether the change is caused by the machine (for which compensation by voltage change may be practical) or the workpiece set (which may require resetting the workpiece set). Furthermore, the value of $R_M$ is typically several times lower than $R_W$. Since these resistances are in parallel, either an insignificant change in $R_M$ or a significant change in $R_W$ may cause a relatively minor change in $R_P$, the measured resistance.

In a test of the theory of the invention using a 10 amp external current source and measuring the voltage drop across the welder electrodes to determine resistance, four different stainless steel studs were measured at a ram force of 1120 pounds. An open circuit measurement showed welder machine resistance $R_M$ to be 40.37 microhms. A measurement of stud #1 in welding position after all surfaces had been cleaned gave a parallel resistance $R_P$ of 36.64 microhms. The workpiece set resistance was calculated to be 396.6 microhms.

Measurements and calculations for the remaining studs gave set resistance of 483.7 microhms for a set with the stud and its socket cleaned, 488.8 microhms for a set with the electrode but not the stud or socket cleaned, and 543.8 microhms for a set with no cleaning on any surface.

These measurements show variations in workset resistance are dependent upon the level of cleaning of the assembly prior to welding. For example, the uncleaned set has a resistance 37% higher than the fully cleaned set. Application of the same welding current to each set would not yield identical welds. This invention would alert the operator prior to the weld, saving the expense of making an unsatisfactory weld.

A prior art measurement of the parallel resistance might not have alerted the operator to the problem, as the parallel resistance for the uncleaned set was 37.6 microhms, only a 3% change from the cleaned set parallel resistance. It is unlikely this small change would tell an operator who was not familiar with this invention that major changes had occured in the weld circuit.

The particular sizes and equipment discussed above are cited merely to illustrated a particular embodiment of this invention. For example, other impedance measuring techniques, as discussed above, could be used. In addition, the invention could be used with other types of resistance welding equipment such as capacitance discharge welders, three phase welders, and homopolar generator welders. It is contemplated that the use of the invention may involve components having different sizes and shapes as long as the principal, using both $R_M$ and $R_P$ to determine changes in $R_W$ prior to weld, is followed. It is intended that the scope of the invention be defined by the claims appended hereto.

We claim:

1. A method of preweld testing of an electric resistance welding machine having a first electrode electrically connected to a first terminal of a source of electrical power, a spaced second electrode electrically connected to a second terminal of a source of electrical power, and pressure means for pressing said first electrode towards said second electrode to hold an electrically conductive workpiece set for resistance welding, said method comprising:
   measuring across said first and second electrodes the welding machine resistance $R_M$;
   placing a workpiece set in welding position under pressure between said first and second electrodes;
   measuring across said first and second electrodes the parallel resistance $R_P$ of $R_M$ and the workpiece set resistance $R_W$;
   calculating $R_W$; and
   comparing $R_W$ with a control value determined from a similar control workpiece set that previously welded properly; wherein a difference between $R_W$ and the control value is an indication that the workpiece set would not weld properly.

2. The method of claim 1 wherein $R_W = (R_P)(R_M)/(R_M - R_P)$.

3. The method of claim 2 further comprising the step of providing an indicating signal when the difference between $R_W$ and the control value exceeds a predetermined value.

4. The method of claim 1 further comprising the step of comparing the value of $R_M$ with a control value of $R_M$ made prior to a successful weld of a control workpiece set.

5. The method of claim 1 wherein said resistances are measured with a direct current.

6. The method of claim 5 wherein the direct current is less than about 20 amperes.

7. The method of claim 1 wherein said first and second terminals are first and second ends of an output transformer winding.

8. A system for checking the preweld resistance of an electric resistance welding machine,
   said machine comprising:
      a first electrode electrically connected to a first terminal of a source of electrical power;
      a spaced second electrode electrically connected to a second terminal of said source of electrical power; and
      pressure means for pressing said first electrode towards said second electrode to hold an electrically conductive workpiece set for resistance welding; and
   control means for controlling the application of electricity to said electrodes, said control means comprising:
      means for measuring across said first and second electrodes the welding machine resistance $R_M$, said measurement being made while both of said electrodes are not in electrical contact with a workpiece set;
      means for measuring across said first and second electrodes the parallel resistance $R_P$ of $R_M$ and the workpiece set resistance $R_W$, said measurement being made while both of said electrodes are in electrical contact with said workpiece set;
      means for calculating $R_W$;

means for comparing $R_W$ with a control value determined from a similar control workpiece set that previously welded properly; and means for providing a signal if the difference between $R_W$ and the control value exceeds a predetermined value, said signal indicating that the workpiece set would not weld properly.

9. The system of claim 8 wherein said means for measuring the resistance includes means for applying a direct current to the resistances.

10. The system of claim 9 wherein said direct current is less than about 20 amperes.

11. The system of claim 8 wherein said signal is applied to said welder contol means, said control means adjusting the application of electricity to said welder in response to said signal.

12. The system of claim 8 wherein said first and second terminals are first and second ends of an output transformer winding.

* * * * *